(12) United States Patent
Forest et al.

(10) Patent No.: US 11,165,400 B2
(45) Date of Patent: Nov. 2, 2021

(54) DEVICE AND METHOD FOR CONDITIONING SIGNALS

(71) Applicant: STMicroelectronics SA, Montrouge (FR)

(72) Inventors: Jeremie Forest, Villard Bonnot (FR); Vincent Knopik, Crets en Belledonne (FR)

(73) Assignee: STMICROELECTRONICS SA, Montrouge (FR)

(*) Notice: Subject to any disclaimer, the term of this patent is extended or adjusted under 35 U.S.C. 154(b) by 0 days.

(21) Appl. No.: 17/024,339

(22) Filed: Sep. 17, 2020

(65) Prior Publication Data
US 2021/0099145 A1 Apr. 1, 2021

(30) Foreign Application Priority Data
Sep. 30, 2019 (FR) ...................................... 1910813

(51) Int. Cl.
| | | |
|---|---|---|
| *H03G 3/30* | (2006.01) | |
| *H03F 3/24* | (2006.01) | |
| *H04B 1/04* | (2006.01) | |

(52) U.S. Cl.
CPC ........... *H03G 3/3042* (2013.01); *H03F 3/245* (2013.01); *H04B 1/04* (2013.01); *H03F 2200/451* (2013.01); *H03G 2201/103* (2013.01); *H03G 2201/307* (2013.01); *H04B 2001/0416* (2013.01)

(58) Field of Classification Search
CPC .......... H03G 3/3042; H03G 2201/103; H03G 2201/307; H03F 3/245; H03F 2200/451; H04B 1/04; H04B 2001/0416
See application file for complete search history.

(56) References Cited

U.S. PATENT DOCUMENTS

| | | |
|---|---|---|
| 9,137,067 B1 | 9/2015 | Xie et al. |
| 2016/0164466 A1 | 6/2016 | Briffa et al. |
| 2018/0026583 A1* | 1/2018 | Yanduru ................. H03F 1/301 |
| | | 330/289 |
| 2019/0158047 A1 | 5/2019 | Watkins |
| 2020/0007092 A1* | 1/2020 | Wang ........................ H03F 3/19 |
| 2020/0144993 A1* | 5/2020 | Saha ........................ H01Q 3/36 |

FOREIGN PATENT DOCUMENTS

EP 2456090 A1 5/2012

* cited by examiner

*Primary Examiner* — Nguyen T Vo
(74) *Attorney, Agent, or Firm* — Slater Matsil, LLP

(57) ABSTRACT

An embodiment electronic device comprises at least two antennas for transmitting signals, and at least one transmission path, the transmission path including a first coupling stage including a power divider, variable-gain power amplifiers, and a second coupling stage including a power combiner. Each coupling stage includes two inputs and two outputs, the two inputs of the first coupling stage being configured to receive a power input signal. Each output of the first coupling stage is connected to a different input of the second coupling stage via the variable-gain power amplifiers, and each output of the second coupling stage is connected to a different antenna. A controller is configured to control the gains of the variable-gain power amplifiers according to the characteristics of the power input signal, the signals transmitted by the antennas, and the coupling stages.

20 Claims, 4 Drawing Sheets

[Fig 1]
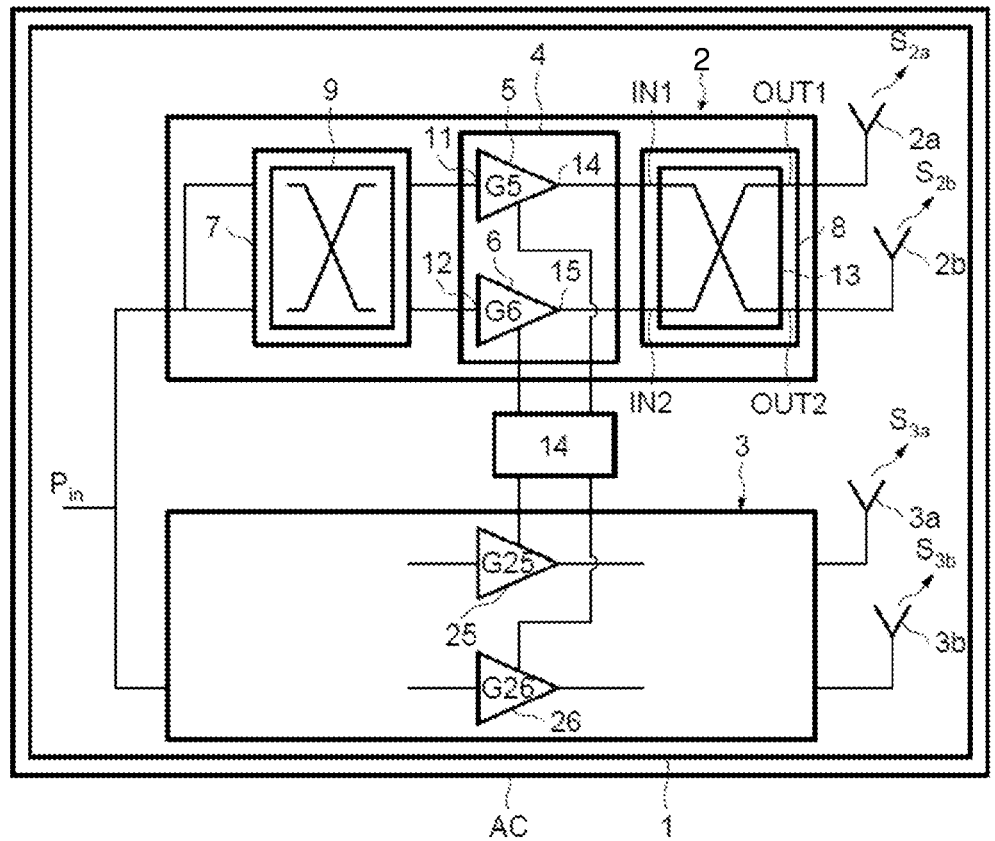
[Fig 2]
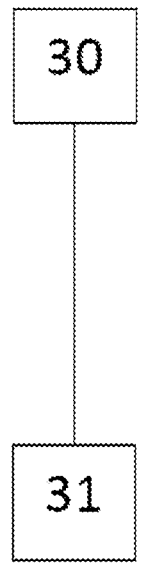

[Fig 3]
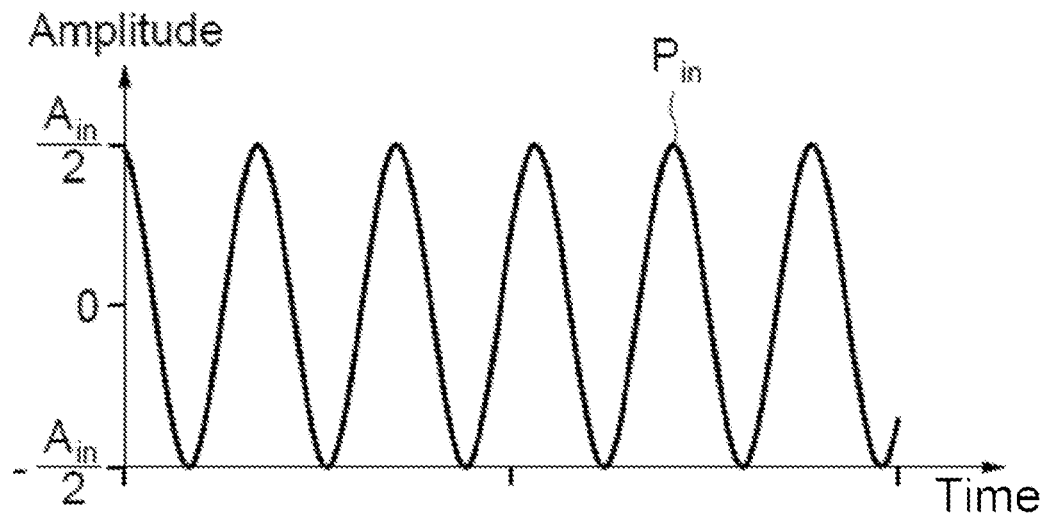
[Fig 4]
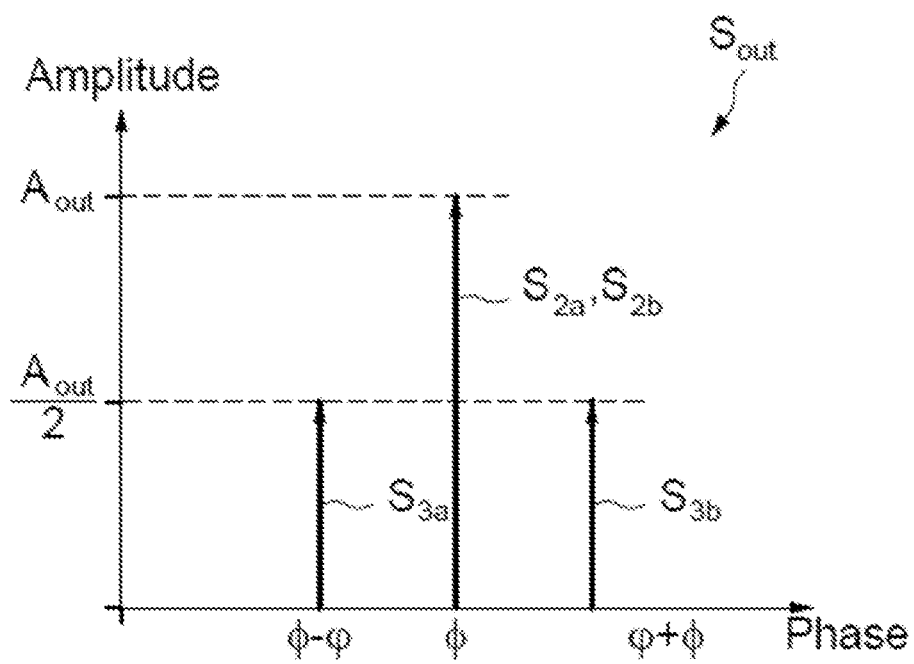

[Fig 5]
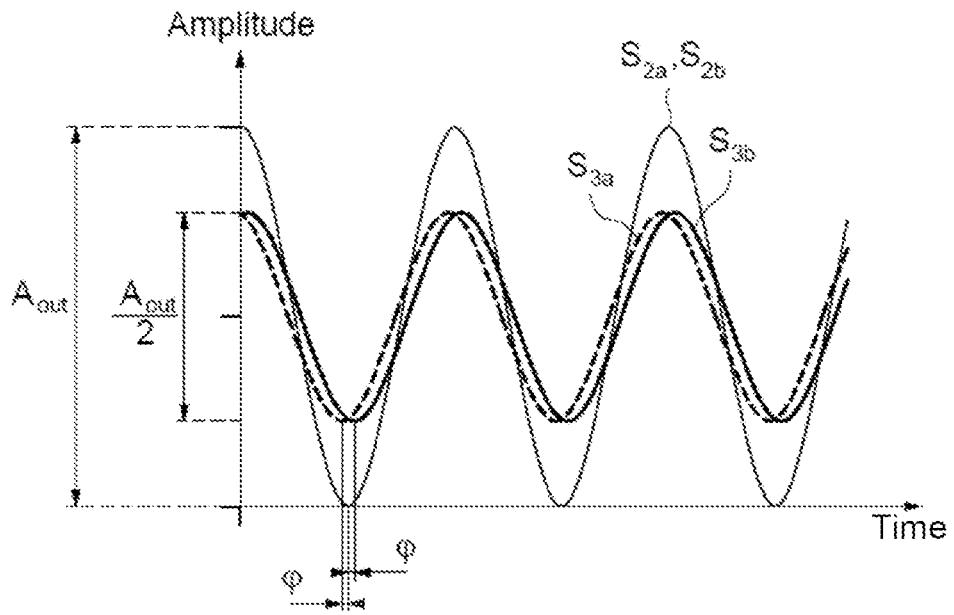
[Fig 6]
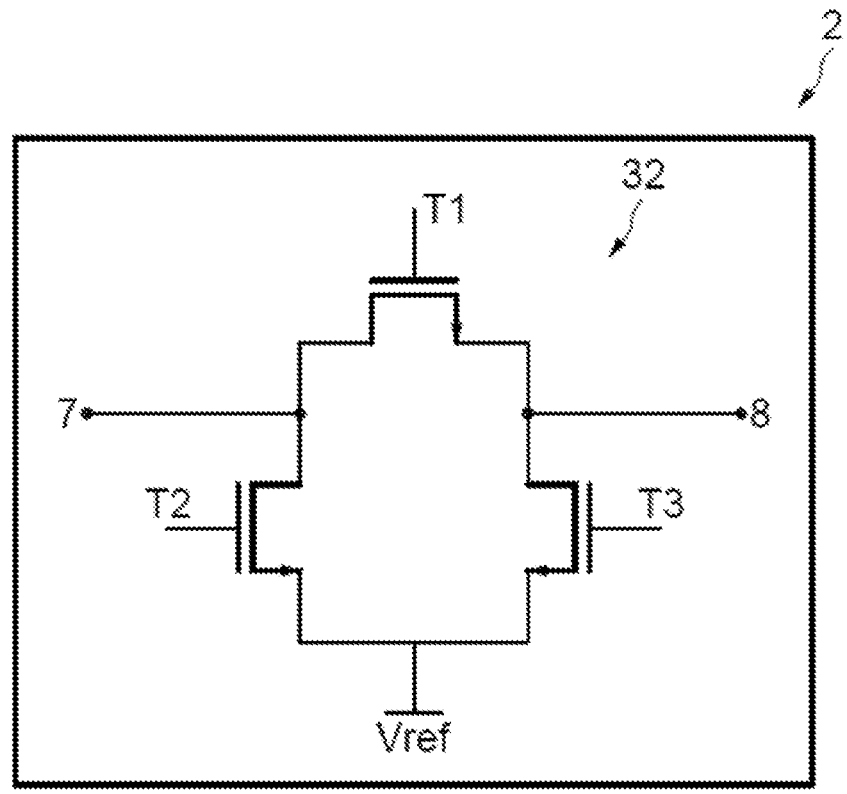

[Fig 7]
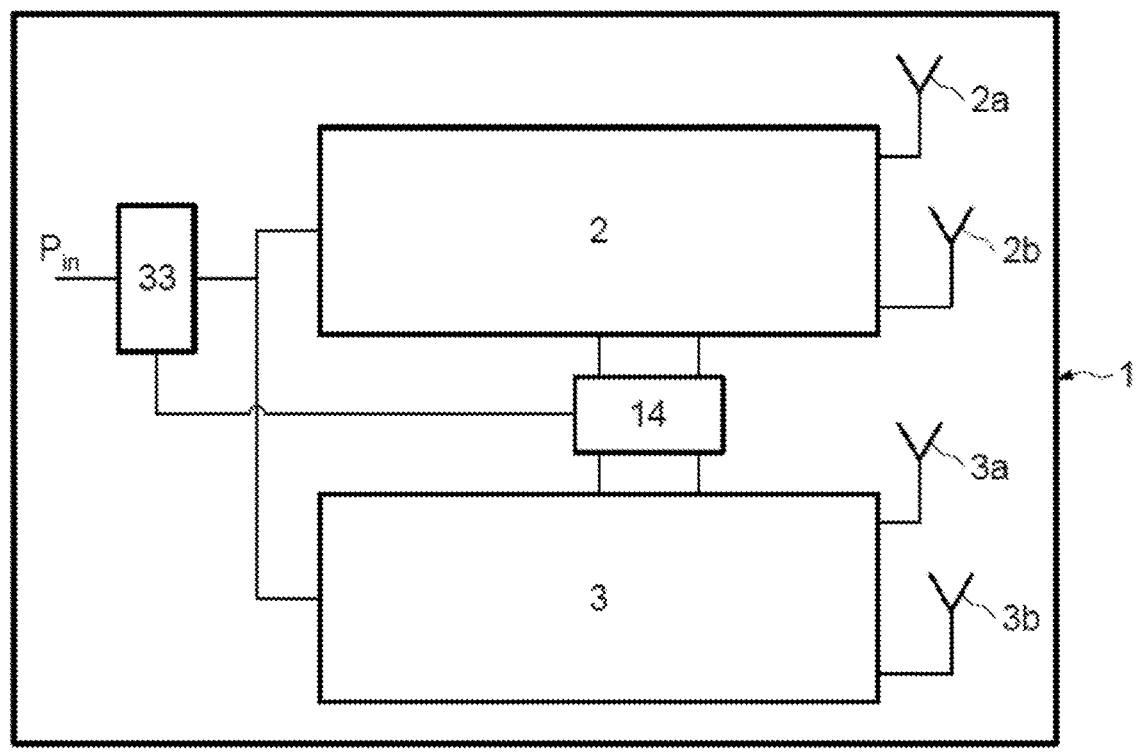

DEVICE AND METHOD FOR CONDITIONING SIGNALS

CROSS-REFERENCE TO RELATED APPLICATIONS

This application claims the benefit of French Application No. 1910813, filed on Sep. 30, 2019, which application is hereby incorporated herein by reference.

TECHNICAL FIELD

Implementations and embodiments of the invention relate to electronic devices and methods for transmitting information, in particular for radiofrequency (RF) applications and more particularly to electronic devices and methods comprising hybrid couplers.

BACKGROUND

Generally speaking, an electronic device for transmitting information by radio comprises a transmission chain including a plurality of transmission lines, each of which is connected to an antenna.

Each transmission line carries out in particular spatial filtering, or beamforming, operations which make it possible to control the phase and amplitude of the signals transmitted by each antenna of the electronic device so as to generate constructive or destructive interference between the transmitted electromagnetic waves.

Generally speaking, a signal that is intended to be transmitted by an antenna passes through the transmission line comprising a first variable-gain amplifier connected to a phase shifter and first and second hybrid coupling stages, which operate as a power divider and as a power combiner, respectively, the two stages each including two inputs and two outputs, each output of the first coupling stage being connected to an input of the second coupling stage by a second variable-gain power amplifier.

The phase shifter is connected to a first input of the first coupling stage and the second input is connected to a first ballast resistor.

A first output of the second stage is connected to the antenna and the second output is connected to a second ballast resistor.

However, each transmission line consumes electrical power to carry out the spatial filtering, in particular the first power amplifier and the phase shifter, the electrical power consumption being proportional to the number of antennas of the device (antenna array).

Furthermore, the installation of each transmission line takes up space on the silicon.

There is therefore a need to provide a technical solution that makes it possible to decrease the consumption of the spatial filtering operations carried out by the transmission chain while decreasing the space taken up by the chain on the silicon.

SUMMARY

According to one aspect, what is disclosed is a method for conditioning signals transmitted by at least two antennas on the basis of a power input signal, the two antennas being connected to a transmission path comprising a first coupling stage including a 90° power divider and a second coupling stage including a 90° power combiner, and variable-gain power amplification means, each coupling stage including two inputs and two outputs, the two inputs of the first coupling stage receiving the power input signal, each output of the first coupling stage being connected to a different input of the second coupling stage via the variable-gain power amplification means, each output of the second coupling stage being connected to a different antenna, the method comprising determining the gains of the amplification means according to the characteristics of the power input signal, to the characteristics of the signals transmitted by the antennas and to the characteristics of the coupling stages.

Signal conditioning is therefore understood here to mean the steps that contribute to producing the signals transmitted by the antennas on the basis of a power input signal.

Coupling the two inputs and outputs of the first and second coupling stages on the transmission paths makes it possible to phase-shift and to amplify the signals transmitted by the antennas without employing a phase shifter, thereby decreasing the consumption and silicon footprint of the transmission paths, the couplers operating as a phase shifter and the phase shift being controlled by adjusting the gains of the amplification means.

According to one implementation, the characteristics of the power input signal comprise the amplitude and the phase shift of the signal, and the characteristics of the signals transmitted by the antennas comprise the amplitude and the phase shift of the transmitted signals with respect to a reference signal.

The phase shift varies within a range from −35° to +35° with respect to the reference signal.

According to another implementation, the characteristics of the coupling stages comprise a loss coefficient for each coupling stage.

According to yet another implementation, the method comprises determining the gain of phase-shifting means that are connected to at least one input of the first coupling stage according to the characteristics of the power input signal, to the characteristics of the signals transmitted by the antennas and to the characteristics of the coupling stages.

Adding the phase-shifting means makes it possible to extend the phase shift over a wider range than that of between −35° and +35°.

According to yet another implementation, the method comprises a first adjustment of the identical gains on the first transmission path that is connected to the two antennas transmitting identical signals forming a reference signal and at least one second adjustment of the gains on at least one second transmission path that is connected to two antennas each transmitting a signal that is phase-shifted with respect to the reference signal.

According to another aspect, what is disclosed is an electronic device comprising at least two antennas for transmitting signals, and at least one transmission path, the transmission path including a first coupling stage including a 90° power divider and a second coupling stage including a 90° power combiner, and variable-gain power amplification means, each coupling stage including two inputs and two outputs, the two inputs of the first coupling stage being intended to receive a power input signal, each output of the first coupling stage being connected to a different input of the second coupling stage via the variable-gain power amplification means, each output of the second coupling stage being connected to a different antenna, the electronic device including control means that are configured to control the gains of the variable-gain power amplification means according to the characteristics of the power input signal, to the characteristics of the signals transmitted by the antennas and to the characteristics of the coupling stages.

According to one embodiment, the characteristics of the power input signal comprise the amplitude and the phase shift of the signal, and the characteristics of the signals transmitted by the antennas comprise the amplitude and the phase shift of the transmitted signals with respect to a reference signal.

According to another embodiment, the characteristics of the coupling stages comprise a loss coefficient for each coupling stage.

According to yet another embodiment, at least one input of the first coupling stage comprises phase-shifting means that are controlled by the control means.

According to yet another embodiment, the variable-gain power amplification means comprise two connecting passive or active amplification means, each means connecting an output of the first coupling stage to a different input of the second coupling stage.

According to yet another embodiment, the passive variable-gain power amplification means comprise at least one array of transistors.

According to yet another embodiment, the active variable-gain power amplification means comprise at least one variable-gain power amplifier.

According to yet another aspect, what is disclosed is a wireless communication device incorporating at least one device such as described above.

BRIEF DESCRIPTION OF THE DRAWINGS

Other advantages and features of the invention will become apparent on examining the detailed description of completely nonlimiting implementations and embodiments and the appended drawings, in which:

FIG. 1 is a schematic block diagram illustrating a wireless communications device including a millimeter radiofrequency device;

FIG. 2 is a block diagram illustrating an implementation of the millimeter radiofrequency device of FIG. 1;

FIG. 3 is a graph illustrating a sine-wave power input signal;

FIG. 4 is a graph illustrating an output signal of the millimeter radiofrequency device of FIG. 1;

FIG. 5 is a graph illustrating signals transmitted by the antennas of the millimeter radiofrequency device of FIG. 1;

FIG. 6 is a schematic illustrating an array of switchable transistors configured to obtain a desired phase shift; and FIG. 7 is a block diagram illustrating another embodiment of the millimeter radiofrequency device of FIG. 1.

DETAILED DESCRIPTION OF ILLUSTRATIVE EMBODIMENTS

FIG. 1 illustrates an embodiment wireless communication device AC, here for example a cellular mobile telephone, including at least one electronic device 1, here for example a millimeter radiofrequency device 1, produced as an integrated device.

The device 1 includes two transmission paths 2 and 3 of the same architecture.

A first transmission path 2 is coupled to two antennas 2a and 2b and the second transmission path 3 is coupled to two antennas 3a and 3b.

The device 1 includes an array of two-by-two antennas.

Of course, the device 1 may include one or more than two transmission paths, each coupled to two antennas.

The transmission paths 2 and 3 may be configured to transmit an RF signal or to receive an RF signal via the antennas 2a, 2b, 3a and 3b.

For simplicity and clarity, given that the transmission paths 2 and 3 are identical, only the first transmission path 2 is described in detail hereinafter.

The first transmission path 2 comprises variable-gain power amplification means comprising an amplifier stage 4 including active elements, for example a first power amplifier 5 of variable gain G5 and a second power amplifier 6 of variable gain G6 which are coupled in parallel between a first coupling stage 7 and a second coupling stage 8.

The first coupling stage 7 comprises a first quadrature hybrid coupler, here for example a 90° power divider with the reference symbol 9, a first input and a second input of which are intended to receive a power input signal Pin, a first output of which is coupled to the input n of the first amplifier 5 and a second output of which is coupled to the input 12 of the second amplifier 6.

In an ideal case, the power of the input signal Pin is distributed equally, via the power divider 9, between the first and second outputs of the power divider 9, with zero phase shift between these first and second outputs.

The first coupling stage 7 generally has a first loss coefficient η1 that is equal for example to 1 dB.

The second coupling stage 8 comprises a second quadrature hybrid coupler, here for example a 90° power combiner with the reference symbol 13, a first input terminal IN1 of which is coupled to the output 14 of the first amplifier 5, a second input terminal IN2 of which is coupled to the output 15 of the second amplifier 6, a first output terminal OUT1 of which is coupled to the antenna 2a and a second output terminal OUT2 of which is coupled to the antenna 2b.

The device 1 further comprises control means 14 that are configured to control the gain of each power amplifier 5 and 6 according to the characteristics of the power input signal Pin, to the characteristics of the signals S2a and S2b transmitted by the antennas 2a and 2b and to the characteristics of the coupling stages 7 and 8.

The control means 14 comprise for example a processing unit configured to control the gain of each power amplifier 5 and 6 according to the characteristics of the power input signal Pin, to the characteristics of the signals S2a and S2b transmitted by the antennas 2a and 2b and to the characteristics of the coupling stages 7 and 8, and embodied for example by a microcontroller.

In an ideal case, the power transmitted to each antenna 2a and 2b is equal to the combination of the powers of the output signals from the amplifiers 5 and 6, which may or may not be phase-shifted with respect to the input signal Pin depending on whether the gains of the amplifiers 5 and 6 are equal or not, as illustrated hereinafter.

The second coupling stage 8 generally has a second loss coefficient η2 that is equal for example to the first loss coefficient η1.

Analogously to the first transmission path 2, the power amplification means of the second transmission path 3 includes a first power amplifier 25 of variable gain G25 and a second power amplifier 26 of gain G26.

Of course, the control means 14 are further configured to control the first power amplifier 25 of variable gain G25 and the second power amplifier 26 of gain G26 of the second transmission path 3 according to the characteristics of the power input signal Pin, to the characteristics of the signals S3a and S3b transmitted by the antennas 3a and 3b and to the characteristics of the coupling stages 7 and 8 of the second transmission path 3.

An example implementation of the device 1 is now described with reference to FIG. 2.

It is assumed that the power input signal Pin is for example a sine-wave signal of amplitude $A_{in}$ centered on zero with a frequency Fc as shown in FIG. 3.

It is also assumed that the device 1 transmits for example an output signal $S_{out}$ with a frequency Fc on the basis of the power input signal Pin; FIG. 4 showing the line spectrum of the output signal $S_{out}$ according to phase.

The signal $S_{out}$ includes a fundamental of amplitude $A_{out}$ with a phase $\Phi$ and two lines of amplitude $A_{out}/2$ with a phase $\Phi-\varphi$ and $\Phi+\varphi$, respectively, $\varphi$ being a predetermined phase shift with respect to the frequency of the signal Pin. It is assumed that the antennas 2a and 2b transmit the fundamental and the antennas 3a and 3b transmit the two lines of amplitude $A_{out}/2$ that are phase-shifted with respect to the line of amplitude $A_{out}$.

In a step 3o, the control means 14 determine the value of the gains G5 and G6 of the first transmission path 2 such that the antennas 2a and 2b together transmit a reference signal of amplitude $A_{out}$ corresponding to the fundamental of the signal $S_{out}$.

The value of the gains G5 and G6 is identical and given by the following equation:

$$G5 = G6 = 20 * \log\left(\frac{\sqrt{\frac{A_{out}^2}{2}}}{10^{\frac{\eta 1}{20}}}\right) \quad (1)$$
$$\sqrt{(A_{in} * 10^{\frac{\eta 1}{20}})^2 + (A_{in} * 10^{\frac{\eta 1}{20}})^2}$$

where log is the logarithm function.

Next, in a step 31, the control means 14 determine the value of the gains G25 and G26 such that the antennas 3a and 3b transmit the two lines of amplitude $A_{out}/2$ which are phase-shifted by $+\varphi$ and $-\varphi$, respectively, with respect to the reference signal.

The control means 14 determine a gain difference $G_{diff}$ equal to:

$$G_{diff} = G25 - G26 = 20 * \log\left(\frac{\sin(\Phi - 45°) - \tan\varphi * \cos(\Phi - 45°)}{\cos(\Phi + 45°) * \tan\varphi - \sin(\Phi + 45°)}\right) \quad (2)$$

where log is the logarithm function, sin is the sine function and cos is the cosine function, and determine the value of the gain G25:

$$G25 = 20 * \log\left(\frac{\sqrt{\frac{A_{out}^2}{2}}}{\sqrt{(A_{in} * 10^{\frac{\eta 1}{20}})^2 + (A_{in} * 10^{\frac{\eta 1}{20}})^2}}\right) \quad (3)$$

where log is the logarithm function.

The control means then determine the value of gain G26:

$$G26 = G25 + G_{diff} \quad (4)$$

FIG. 5 illustrates a representation of the signals Sea and S2b that form the reference signal transmitted by the antennas 2a and 2b, and of the signals S3a and S3b transmitted by the antennas 3a and 3b.

Coupling the two inputs and outputs of the first and second coupling stages on the transmission paths 2, 3 makes it possible to phase-shift and to amplify the signals transmitted by the antennas without employing a phase shifter, thereby decreasing the consumption and silicon footprint of the transmission paths, the couplers operating as a phase shifter and the phase shift being controlled by adjusting the gains of the amplification stages 4.

According to another embodiment of the transmission path 2, the variable-gain power amplification means may comprise passive elements, for example arrays of switchable transistors that are controlled by the control means 14, which are configured to obtain the desired phase shift $\varphi$ instead of the variable-gain power amplifiers, one array of transistors replacing one variable-gain power amplifier. In this case, the signals transmitted by the antennas are not amplified.

FIG. 6 illustrates an array of transistors 32 comprising three transistors T1, T2 and T3, the gates of which are connected to the control means, the drains of the transistors T1 and T2 being connected to one another and to an output of the first coupling stage 7, the source of the transistor T1 and the drain of the transistor T3 being connected to an input of the second coupling stage 8 and the sources of the transistors T2 and T3 being connected to a reference potential Vref chosen according to the gain value of the array 32.

The phase shift $\varphi$ varies within a range from −35° to +35° with respect to the signal Pin.

FIG. 7 illustrates another embodiment of the device 1 that makes it possible to obtain a phase shift $\varphi$ outside of the range from −35° to +35°.

This embodiment differs from the embodiment disclosed in FIG. 1 in that phase-shifting means 33 controlled by the control means 14 are inserted at the input of the transmission paths 2 and 3.

The phase-shifting means 33 allow the signal Pin to be pre-phase-shifted.

What is claimed is:

1. A method comprising:
   receiving, by two inputs of a first coupling stage having a 90° power divider, a power input signal;
   dividing, by the first coupling stage, the power input signal into two divided power input signals;
   amplifying, by respective variable-gain power amplifiers, the two divided power input signals;
   receiving, by two respective inputs of a second coupling stage having a 90° power combiner, the two amplified power input signals;
   combining, by the second coupling stage, the two amplified power input signals into two combined power input signals;
   transmitting, by respective different antennas, the two combined power input signals to provide two transmitted signals; and
   controlling, by a controller, gains of the variable-gain power amplifiers in accordance with characteristics of the power input signal, characteristics of the two transmitted signals, and characteristics of the first and second coupling stages.

2. The method according to claim 1, wherein the characteristics of the power input signal comprise an amplitude and a phase shift of the power input signal, and the characteristics of the two transmitted signals comprise amplitudes and phase shifts of the two transmitted signals with respect to a reference signal.

3. The method according to claim 1, wherein the characteristics of the first and second coupling stages comprise a loss coefficient for each of the first and second coupling stages.

4. The method according to claim 1, further comprising controlling, by the controller, at least one phase shifter coupled to at least one input of the first coupling stage.

5. The method according to claim 4, further comprising controlling a gain of the phase shifter in accordance with the characteristics of the power input signal, the characteristics of the transmitted signals, and the characteristics of the first and second coupling stages.

6. The method according to claim 1, wherein:
a first transmission path comprises the first coupling stage, the respective variable-gain power amplifiers, and the second coupling stage;
the first transmission path is connected to the respective different antennas; and
the method further comprises:
identically setting, by the controller, the gains of the variable-gain power amplifiers such that the two transmit signals are identical and together form a reference signal;
receiving, by at least one second transmission path, the power input signal; and
at least one adjusting, by the controller, second gains on the at least one second transmission path that is connected to two second antennas each transmitting a respective second transmit signal that is phase-shifted with respect to the reference signal.

7. An electronic device comprising:
two antennas for transmitting transmit signals;
a transmission path comprising:
a first coupling stage including two inputs, a 90° power divider, and two outputs, wherein the two inputs of the first coupling stage are configured to receive a power input signal;
two variable-gain power amplifiers; and
a second coupling stage including two inputs, a 90° power combiner, and two outputs, wherein each output of the first coupling stage is connected to a different input of the second coupling stage via the variable-gain power amplifiers, and wherein each output of the second coupling stage is connected to a different antenna; and
a controller coupled to the variable-gain power amplifiers, and configured to control gains of the variable-gain power amplifiers in accordance with characteristics of the power input signal, characteristics of the transmitted signals, and characteristics of the first and second coupling stages.

8. The electronic device according to claim 7, wherein the characteristics of the power input signal comprise an amplitude and a phase shift of the power input signal, and wherein the characteristics of the transmitted signals comprise amplitudes and phase shifts of the transmitted signals with respect to a reference signal.

9. The electronic device according to claim 7, wherein the characteristics of the first and second coupling stages comprise a loss coefficient for each coupling stage.

10. The electronic device according to claim 7, wherein at least one input of the first coupling stage comprises a phase shifter that is controlled by the controller.

11. The electronic device according to claim 10, wherein the controller is coupled to the phase shifter, and configured to control a gain of the phase shifter in accordance with the characteristics of the power input signal, the characteristics of the transmitted signals, and the characteristics of the first and second coupling stages.

12. The electronic device according to claim 7, wherein the variable-gain power amplifiers are passive amplifiers.

13. The electronic device according to claim 12, wherein the passive amplifiers each comprises at least one array of transistors.

14. The electronic device according to claim 7, wherein the variable-gain power amplifiers are active amplifiers.

15. A wireless communication device comprising:
four antennas for transmitting transmit signals;
first and second transmission paths, each transmission path comprising:
a first coupling stage including two inputs, a 90° power divider, and two outputs, wherein the two inputs of the first coupling stage are configured to receive a power input signal;
two variable-gain power amplifiers; and
a second coupling stage including two inputs, a 90° power combiner, and two outputs, wherein each output of the first coupling stage is connected to a different input of the second coupling stage via the variable-gain power amplifiers, and wherein each output of the second coupling stage is connected to a different antenna; and
a controller coupled to the variable-gain power amplifiers of the first and second transmission paths, wherein the controller is configured to control gains of the variable-gain power amplifiers of the first and second transmission paths in accordance with characteristics of the power input signal, characteristics of the respective transmitted signals, and characteristics of the respective first and second coupling stages.

16. The wireless communication device according to claim 15, wherein the controller is configured to:
identically set the gains of the variable-gain power amplifiers of the first transmission path such that the transmit signals associated with the first transmission path are identical and together form a reference signal; and
adjust the gains of the variable-gain power amplifiers of the second transmission path such that the transmit signals associated with the second transmission path are phase-shifted with respect to the reference signal.

17. The wireless communication device according to claim 15, wherein the characteristics of the power input signal comprise an amplitude and a phase shift of the power input signal, and wherein the characteristics of the transmitted signals comprise amplitudes and phase shifts of the transmitted signals with respect to a reference signal.

18. The wireless communication device according to claim 15, wherein the characteristics of the first and second coupling stages comprise a loss coefficient for each coupling stage.

19. The wireless communication device according to claim 15, wherein at least one input of at least one first coupling stage comprises a phase shifter that is controlled by the controller.

20. The wireless communication device according to claim 19, wherein the controller is coupled to the phase shifter, and configured to control a gain of the phase shifter in accordance with the characteristics of the power input signal, the characteristics of the respective transmitted signals, and the characteristics of the respective first and second coupling stages.

* * * * *